United States Patent
Kaply et al.

(10) Patent No.: US 7,375,278 B2
(45) Date of Patent: May 20, 2008

(54) MOUNTING COMPONENTS TO A HARDWARE CASING

(75) Inventors: Michael Aaron Kaply, Leander, TX (US); Walter Chun-Won Lee, Cedar Park, TX (US); Jonas Sicking, Austin, TX (US); Lloyd Bernard Stearn, Jr., Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/371,131

(22) Filed: Mar. 8, 2006

(65) Prior Publication Data

US 2006/0151201 A1 Jul. 13, 2006

Related U.S. Application Data

(62) Division of application No. 10/782,455, filed on Feb. 19, 2004, now Pat. No. 7,291,783.

(51) Int. Cl.
*H02G 3/08* (2006.01)

(52) U.S. Cl. ........................ 174/50; 174/520; 361/719; 361/752; 29/825; 29/832; 29/846

(58) Field of Classification Search .................. 29/825, 29/832, 841, 846, 847, 848; 361/719, 704, 361/752, 796, 600, 736, 748; 174/50, 520
See application file for complete search history.

(56) References Cited

U.S. PATENT DOCUMENTS

| | | | | |
|---|---|---|---|---|
| 2,803,788 A | * | 8/1957 | Sanders, Jr. | 361/736 |
| 3,614,541 A | * | 10/1971 | Farrand | 361/730 |
| 4,502,098 A | | 2/1985 | Brown et al. | |
| 4,668,314 A | * | 5/1987 | Endoh et al. | 156/64 |
| 4,931,908 A | | 6/1990 | Boucard et al. | |
| 5,473,511 A | | 12/1995 | Reddy et al. | |
| 6,018,465 A | | 1/2000 | Borkar et al. | |
| 6,473,304 B1 | | 10/2002 | Stevens | |
| 6,501,031 B1 | * | 12/2002 | Glovatsky et al. | 174/262 |
| 6,600,658 B2 | * | 7/2003 | Iwata | 361/752 |
| 6,621,706 B2 | | 9/2003 | Tzlil et al. | |
| 6,997,043 B2 | * | 2/2006 | Swanson et al. | 73/49.3 |
| 7,168,152 B1 | * | 1/2007 | Ehret et al. | 29/600 |
| 2002/0196603 A1 | | 12/2002 | Curlee et al. | |

* cited by examiner

*Primary Examiner*—Dhiru R. Patel
(74) *Attorney, Agent, or Firm*—Herman Rodriguez; Schubert Osterrieder & Nickelson PLLC

(57) ABSTRACT

Methods, systems, and media to mount one or more components to a hardware casing are disclosed. Embodiments include hardware and/or software for determining a pattern of interconnects to apply to an interior surface of the hardware casing. The pattern includes at least one independent path for transmitting a signal between the components. The pattern of interconnects is then applied to the interior surface, the application being configured for the topography of the interior surface to couple the components with the pattern of interconnects. In many embodiments, the components may then be mounted to the casing and interconnected with the interconnects. And, in some embodiments the pattern of interconnects may be coupled with a circuit board having additional components.

11 Claims, 4 Drawing Sheets

MOUNTING COMPONENTS TO A HARDWARE CASING

CROSS-REFERENCE TO RELATED APPLICATION

Pursuant to 35 USC § 121, this divisional application claims priority to and benefit of U.S. Utility patent application Ser. No. 10/782,455 now U.S. Pat. No 7,291,783, filed Feb. 19, 2004, on behalf of inventors Kaply et al., entitled "MOUNTING COMPONENTS TO A HARDWARE CASING".

FIELD OF INVENTION

The present invention is in the field of computer hardware architecture. More particularly, the present invention relates to methods and arrangements to mount one or more components to a hardware casing and to interconnect the components with a pattern of interconnects applied to the hardware casing.

BACKGROUND

Electronic components are often assembled and interconnected on a flat surface known as a circuit board. Circuit boards are typically divided into two broad categories: those intended for prototype or experimental circuits; and those intended for production or commercial sale. Circuit boards used for experimental work are often referred to as breadboards, which allow engineers to construct circuits quickly and often without regard to efficiency of component layout. In contrast, circuit boards intended for commercial sale typically have highly reliable wires and interconnects, permanent bonds to all components, or at least their mounts, and topographies amenable to mass production and thorough testing. Further, these circuit boards are typically made of a material that is reliable, low-cost, and easy to manufacture, typically a fiberglass substrate with copper wires etched from laminated copper sheets. Components are permanently affixed to production boards using a soldering process. The Digilab board is a simple example of such a board.

Though printed circuit board design of a circuit board intended for production involves many considerations including circuit timing issues, voltage dividers, capacitive reactance, crosstalk simulations, and power supply voltages, these circuit boards offer several advantages such as consistency and modularity. A circuit board serves as a consistent, uniform surface on which to design. Additionally, after a circuit board has been designed, it may be included within innumerable exteriors, which are typically more economical to redesign than a circuit board design. As well, a circuit board may be small enough to serve as a modular component of a larger system, for example, a module of random access memory (RAM).

Devices, however, are progressing toward smaller sizes and, as a result, designers are pressed to condense the space requirements of the circuit boards and components while maintaining the organizational advantages. Further, more and more devices are being automated by incorporating circuit boards for increased functionality, many of which involve a diminutive size and weight to be incorporated feasibly. For example, the operable ease and usefulness of a combined personal digital assistant (PDA) and mobile phone may depend on the size.

Additionally, the ability to reduce size and weight of a circuit board device would facilitate further designs. For example, many times size restrictions may be imposed on a design engineer of a subcomponent of a larger system or a subcomponent to upgrade or improve an existing system. If the design engineer succeeds in including more effective circuitry with increased functionality into less space with less weight, the design engineer may accommodate a more robust product.

The resulting size of a design is limited by the size of the components necessary to implement the design as well as the circuit board(s). Components may include independently manufactured circuits, chips, or the like, to plug into the circuit board of the device and are typically combined with interconnects. Interconnects typically include electrically conductive material to carry electrical signals for power and/or communications between components.

One common type of component mounted on circuit board devices is a sensor. The design and manufacture of many sensors may involve highly specialized knowledge and techniques. As design engineers reduce the size of the sensors, the size of circuit boards adapted to interconnect the sensors with other components becomes a more significant design factor. When size is significant, because a circuit board device may not be reduced beyond the dimensions of its circuit board, some size or weight-sensitive devices may not feasibly incorporate a circuit board. Thus, such devices may not feasibly include some desired functionality.

In some cases, the inability to reduce a circuit board device is a critical problem. For example, currently because of size reduction restrictions, a pacer generator may be felt under the skin and a slight deformity of the skin can be visually noticed.

A solution to reduce size and weight of a circuit board device has been to fit more components onto a smaller circuit board by situating multiple layers of interconnects within an insulating material to connect components. However, this solution is not effective, for example, in a circumstance of very few components, layering the interconnects does not substantially condense the size or reduce the weight.

Therefore, there is a need for methods and arrangements capable of reducing size and weight of devices that include components and interconnects.

SUMMARY OF THE INVENTION

The problems identified above are addressed by methods and arrangements to mount components to a hardware casing. One embodiment provides a method to fasten components to a hardware casing of a device. The method generally includes designing, manufacturing, assembling, or the like, a pattern of interconnects which may be applied to an interior surface of the hardware casing. For this method, the pattern of interconnects provides a path for transmitting a signal between the components to be mounted. Also, for this method, the pattern is designed to be able to mount the components to the interior surface of the hardware casing based on the topography of the interior surface. The method further includes applying the pattern of interconnects to the interior surface. The pattern is applied in such a way that, on the interior surface, the components are able to be coupled with the pattern of interconnects based upon the topography of the interior surface.

According to the method, applying may also comprise applying a second layer of material over the pattern of interconnects, wherein the second layer comprises a non-conductive material, a second pattern of interconnects, and a connection to the first pattern of interconnects.

An additional embodiment provides a hardware casing for mounting components of a device. The hardware casing includes a pattern of interconnects applied to an interior surface of the hardware casing based on the topography or physical features of the interior surface. The pattern of interconnects on the interior surface is capable of transmitting signals, particularly providing a path for transmitting a signal between the components. The hardware casing also includes mounting sites designed to mount the components to the interior surface and coupled with the pattern of interconnects. Within the hardware casing, the mounting sites are positioned based upon the topography of the interior surface.

A further embodiment provides a system that includes a device encased by a hardware casing. The system involves components that are manufactured independently and capable of performing separate functions of the device. In addition, the system includes a pattern of interconnects applied to an interior surface of the hardware casing. In this system, the pattern includes a path for transmitting a signal between components mounted on the hardware casing and independently manufactured and designed to perform separate functions. Moreover, the pattern of interconnects is fastened to the casing based upon a topography of the interior surface. Further, the system typically includes mounting sites to couple the components to the interior surface. In this system, the mounting sites are coupled with the pattern of interconnects and positioned based upon the topography.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

Introduction

The following is a detailed description of embodiments of the invention depicted in the accompanying drawings. The embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements are contemplated to mount one or more components to a hardware casing. In one embodiment, one or more components are mounted to a casing to reduce space and weight of a circuit board within the casing. Interconnects are applied to the casing to provide connections over which multiple components may transmit signals. The interconnects may be applied by painting conductive lines onto the casing, coating the casing with a metal and/or etching conductive lines from the metal, adhering a laminate to the casing on which the interconnects are printed, among other possibilities.

In many embodiments, interconnects may be applied and components may be mounted to the hardware casing to supplement circuitry of circuit boards within the device. Locations to mount components may be selected based upon the type and function as well as the shape of the component for ease of mounting and interconnection with other components. Mounting components onto the casing lends the advantage of coupling to the pattern of interconnects directly through the casing to a particular component, a sensor, to be located on the exposed side of the casing.

DETAILED DESCRIPTION

Figure 1:
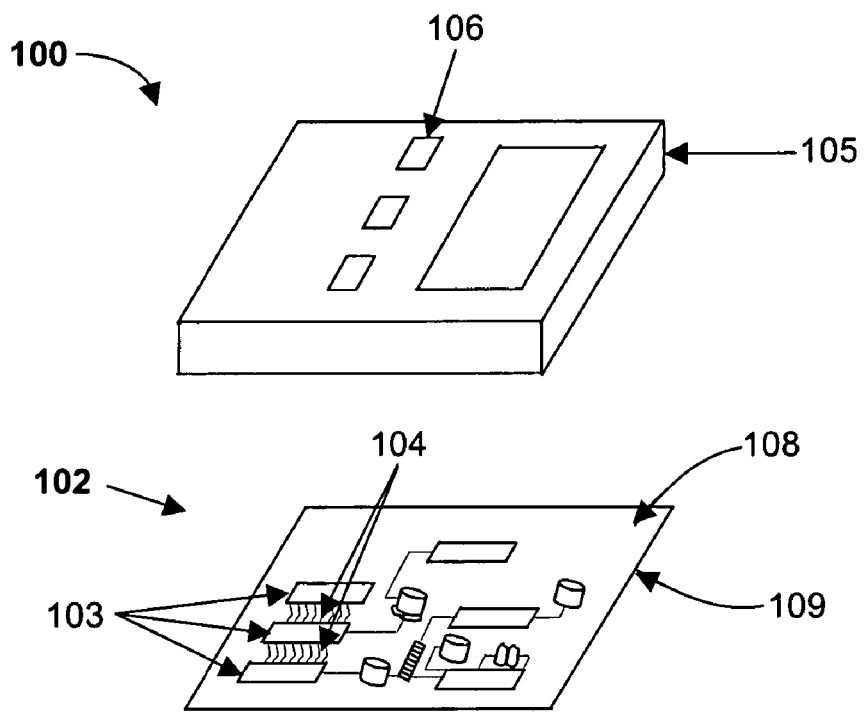
FIG. 1 depicts an embodiment of an audio device having one or more components interconnected and mounted via a hardware casing.

Turning now to the drawings, FIG. 1 depicts an embodiment of a system to mount one or more components to a hardware casing. In FIG. 1, the system includes an audio device (100) such as a digital voice recorder or an MP3 player. Audio device (100) includes components mounted to and communicatively coupled via a pattern of interconnects on a hardware casing (105). Audio device (100) saves space and weight by reducing space and weight of at least part of a circuit board by mounting components to a hardware casing (105), using hardware casing (105) and a bottom casing (102) to function as a circuit boards as well as an enclosure.

Hardware casing (105) and bottom casing (102) is composed of a material that does not conduct current. Therefore, hardware casing (105) insulates a user who may be in contact with hardware casing (105) or bottom casing (102) from electrical power and control signals transmitted via the pattern of interconnects and insulates the independent paths of interconnects from one another. For instance, hardware casing (105) may be a plastic.

Hardware casing (105) and bottom casing (102) may also conduct heat, dissipating heat generated by operation of the components via direct contact with the components. In some embodiments, heat sinks may be designed into the hardware casing (105) and/or bottom casing (102) at mounts for components to accelerate heat dissipation.

Hardware casing (105) may include components such as switches (106). Switches (106) may be touch buttons, advantageously thinner than many other buttons, to accommodate a smaller interior space of audio device (100). For instance, in some embodiments, switches (106) may include thin optical switches. The optical switches may toggle in response to changes in light sensed by the switches. For example, switches (106) may include an infrared sensing beam and a slight cavity. When an infrared sensing beam is interrupted by a user's finger in the touch area located in the yoke of the slight cavity, the switch may recognize operation by a user and generate an output in response. In such embodiments, audio device (100) may include circuitry that responds to a change in state of the optical switches internal to audio device (100) to initiate recording, stop recording, play a recording, or other related functions.

In another embodiment, switches (106) may be pressure sensitive. In such embodiments, switches (106) may be coupled with a pattern of interconnects on an interior surface (not shown) of the hardware casing (105) to integrate functionality of switches (106) with other components of audio device (100). In a further embodiment, switches (106) may be a button functioning via a capacitive touch switch.

Bottom casing (102) may include a pattern of interconnects such as interconnects (104) on a thin plate and mounting sites where components (103) such as chips and other electronic devices are mounted. Bottom casing (102) complements hardware casing (105) to enclose components (103) and a pattern of interconnects (104) of audio device (100). Bottom casing (102) also functions as a circuit board for one or more components (103) and the pattern of interconnects (104). In other embodiments, bottom casing (102) is not necessarily at the base of audio device (100), but merely a portion of the casing that also serves as a circuit board.

Mounting sites of bottom casing (102) provide a location where a component may be added and be connected with the pattern of interconnects (104). In one embodiment, mounting sites include mounts, while in other embodiments, mounting sites may be a broadening of an interconnect on which a component may be placed. In further embodiments, a mounting site is a location where some metal is spread for a component to be placed on top of it. The metal is then heated to melt into the component and electrically couple the metal and component together.

The material of bottom casing (102) may be constructed of a material sufficient to support and protect audio device (100) such as a resilient plastic. To add to the slenderness of the device, a thin battery (not shown) may power the circuitry of audio device (100) and contribute to a reduced width of audio device (100). In one embodiment, the thin battery may be a small rectangular polymer coated with an anode and cathode, for example, the Power Paper Standard Cell STD-2. Further, multiple batteries may be interconnected in series and/or in parallel for increased voltage and/or current requirements.

Components (103) may include independently manufactured electronic devices that may include circuits, integrated circuits, and the like. In one embodiment, audio device (100) may utilize components such as a processor, a microphone, a speaker, and a display. The microphone may couple with a component such as an analog to digital (A/D) converter to convert analog voice signals into digital data for storage in a memory component. In several embodiments, components (103) also include interfaces for external components such as external microphones, ear pieces, or storage devices.

Further, components (103) may include sensors (not shown) that detect environmental conditions, or conditions external to audio device (100). Sensors may be mounted several places on the bottom casing (102), including, for example, on the outside surface (109) of audio device (100), opposite from the interior surface (108). Alternatively, sensors may be coupled with the interior surface (108) of bottom casing (102) and may be sensitive to changing environmental conditions via a direct coupling with bottom casing (102). For example, audio device (100) may include a heart beat monitor and include a strap for an arm or wrist of the user, allowing the user to listen to a recording and monitor the user's heart rate while jogging.

Interconnects (104) include electrically conducting material to transmit signals between two or more components (103). The application of interconnects (104) to bottom casing (102) is further discussed with respect to FIG. 2.

Utilizing bottom casing (102) and hardware casing (105) as both the enclosure and the circuit boards, advantageously reduces the weight and space typically added by independent circuit boards. The weight and size reduction can be implemented in new designs and in retrofits of current designs.

Figure 2:
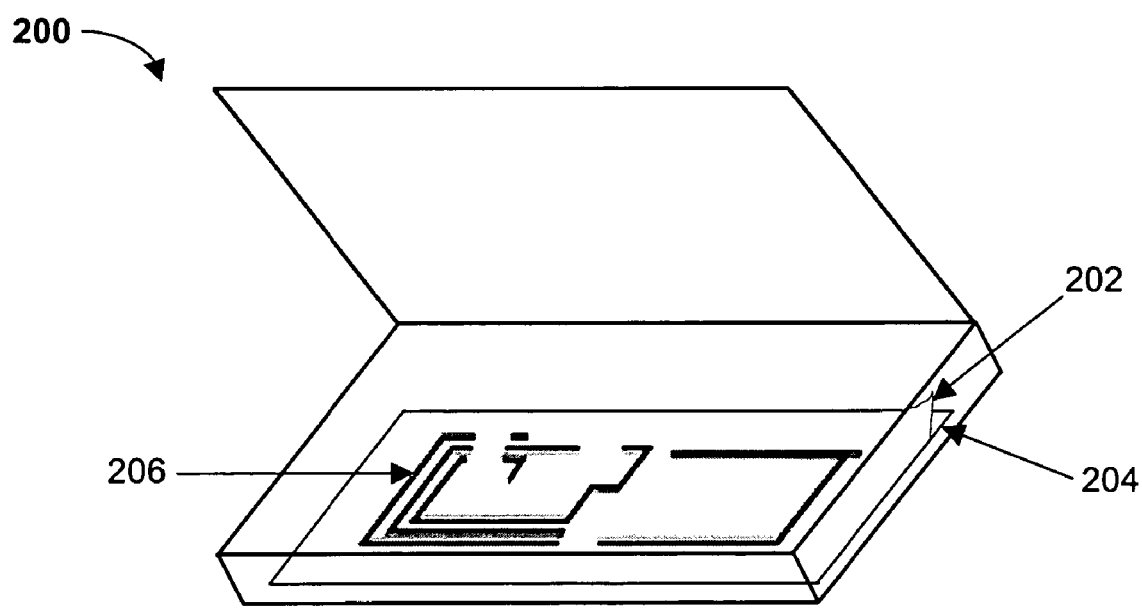
FIG. 2 depicts a portable computer that includes a bottom casing upon which a pattern of interconnects has been applied to mount components to lessen the weight and size of the portable computer.

Turning now to FIG. 2, a portable computer (200) is shown that includes a bottom casing (202) providing a supportive base to which a pattern of interconnects (206) have been applied and one or more components (208) have been mounted. To lessen the weight and size of portable computer (200), the components and interconnects are included on the casing which reduce the size of a motherboard or, in some embodiments, eliminates an internal circuit board.

Interconnects (206) may be applied to the bottom casing (202) of portable computer (200) in a variety of ways. In one embodiment, interconnects (206) are printed onto bottom casing (202) by applying a very thin covering of metal (204), typically copper. Then, wire patterns in the configuration of interconnects (206) may be printed onto the metal surface using a compound that resists etching. Next, the bottom casing (202) may be subjected to a chemical etching process that removes excess metal. The remaining unetched metal may form wires that interconnect components and small pads that define regions where component leads may be attached. In one embodiment, this process is conducted with a circuit computer-aided manufacturing software program used to design products such as electronic circuit boards in computers and other devices. For example, LPKF® Laser & Electronics AG, Computer-Aided Drafting/Computer-Aided Manufacture (LPKF® CAD/CAM) Systems, using a Board-Master program to control operation of a circuit manufacture machine, may produce the pattern of interconnects on the interior surface of the hardware casing.

In another embodiment, interconnects (206) may be applied with a mesh screen. Via a mesh screen, a solder mask may be applied to a printed circuit board by forcing the solder through the screen and onto the board to form interconnects (206). As well, in some embodiments, interconnects (206) may be applied by hand-painting a conductive material onto the casing (202).

Figure 3:
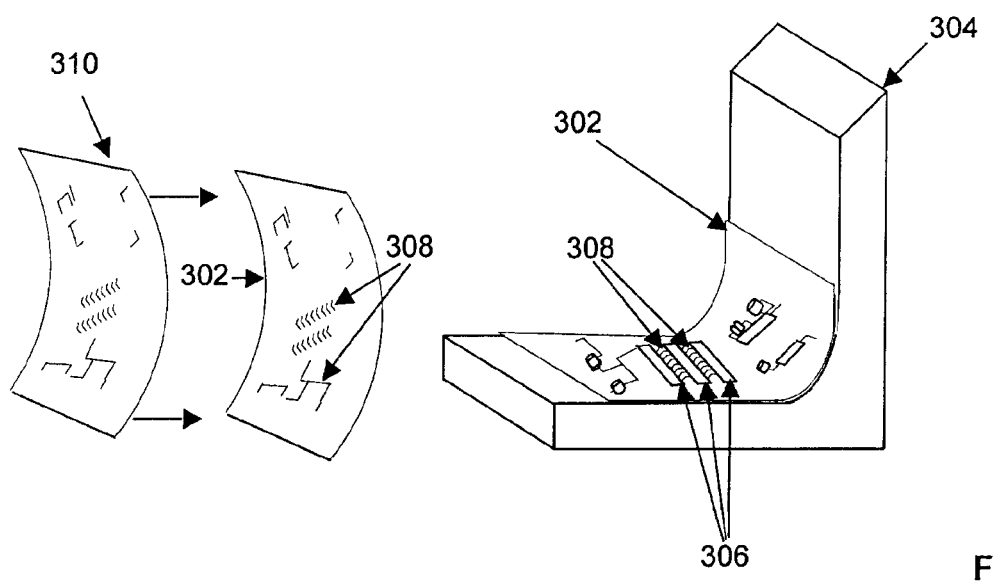
FIG. 3 depicts interconnects applied to a hardware casing via a thin laminate to be adhered to a hardware casing.

In further embodiments, as illustrated in FIG. 3, a pattern of interconnects (308) may be applied to a hardware casing (304) via with a very thin laminate (302). Laminate (302) may provide a regular surface on which to apply the pattern of interconnects (308) and then the laminate is attached to hardware casing (304). In some embodiments, laminate (302) is a flexible material that conforms to the contours of the hardware casing (304). In other embodiments, laminate (302) may become flexible and conforms to the contours of hardware casing (304) with an application of, e.g., heat and/or chemicals.

Laminate (302) is then coupled with the casing (304). In several embodiments, laminate (302) is glued to the (304). Then components (306) are mounted to the hardware casing (304), coupling the components (306) with the pattern of interconnects (308). A person of ordinary skill in the art will readily observe that the pattern of interconnects (308) may be applied to laminate (302) with several techniques. In one embodiment, interconnects (308) are painted onto the laminate (302). In another embodiment, interconnects (308) are applied to the laminate (302) by printing and etching a path of connections to connect components (306) to be mounted onto the laminate (302), analogous to the process in FIG. 2.

A second layer of material (310) maybe applied over the pattern of interconnects, wherein the second layer comprises a non-conductive material, a second pattern of interconnects, and a connection to the first pattern of interconnects (308).

Figure 4:
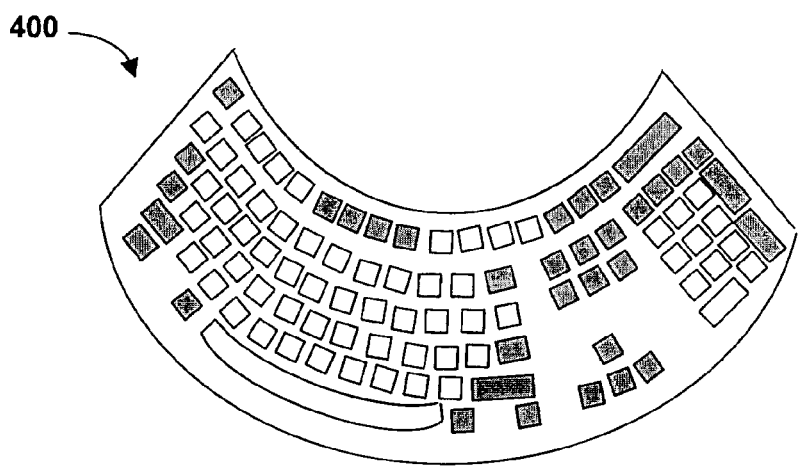
FIG. 4 depicts an embodiment of a pliable keyboard made of flexible, nonconductive material.

Turning now to FIG. 4, there is shown an embodiment of a pliable keyboard (400) made of flexible, nonconductive material. FIG. 4 illustrates that in one embodiment of the present invention, a pattern of interconnects is printed directly onto a casing instead of onto a circuit board, advantageously reducing the weight and thickness of the keyboard (400) by removing the necessity of mounting the circuit board. The type of casing is not limited; it may be any size, shape, pliability, or the like.

In one embodiment, the pliable keyboard (400) is made of rubber that may be rolled up or folded without destroying the functionality of the keyboard (400). The pattern of interconnects is then painted onto an interior surface of the rubber keyboard with a pliable, conductive paint. Keyboard (400) may be used in conjunction with a PDA, handheld computer, mobile telephone, cash register, or the like. Embodiments are capable of utilizing a non-flat surface for a hardware casing on which interconnects may be imprinted.

Figure 5:
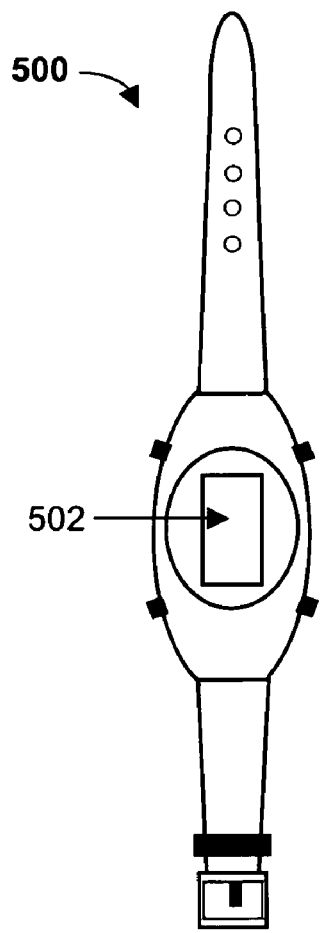
FIG. 5 depicts an embodiment of a sports watch having a pattern of interconnects applied to the casing of the watch and components mounted to the casing.

FIG. 5 depicts a sports watch (500) as an embodiment of another system with interconnects applied and components mounted to its hardware casing. Sports watch (500) includes one component as a sensor (502) to detect environmental conditions, for example, a wearer's temperature. Sensor (502) may be located on another side of the hardware casing than the mounted components. Accordingly, sensor (502) is conveniently coupled with the interconnects directly through the hardware casing.

In further embodiments, sports watch (500) may include a mobile telephone that a person may strap onto his body to both keep connected with conversations and maintain knowledge of the person's body temperature, periodic blood pressure, or the like, in a lightweight fashion. In further embodiments, the form factor, or size, configuration, or physical arrangement, may also include semi-permanent curvature, such as a cuff bracelet within which is a mobile telephone, recorder, computer, or MP3 player, for example.

Figure 6:
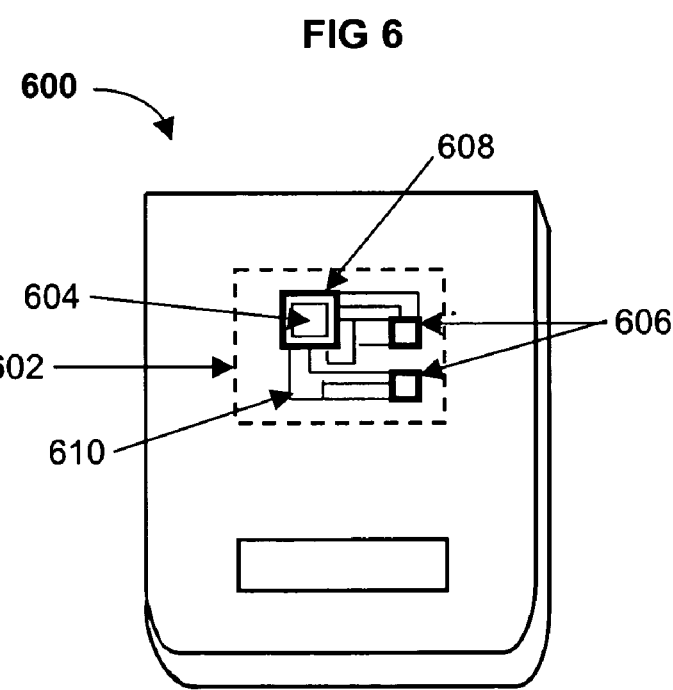
FIG. 6 depicts an embodiment of a PDA having a section of casing with components and interconnects.

Turning now to FIG. 6, it is shown an embodiment of a PDA (600) which may also be a handheld computer or a combination of a cell phone with further processing capabilities. In one embodiment, PDA (600) includes a section of its casing (602) having components such as a processor (604) and memory (606) coupled with a pattern of interconnects (610). Including circuitry on the casing reduces weight and space by allowing the casing to support and organize the circuitry inside PDA (600). In some embodiments, PDA (600) includes mounts such as mount (608) to interconnect a component (604) with the pattern of interconnects (610) and components mounted onto the casing (602). In further embodiments, additional interconnects and components may be mounted on a circuit board and coupled with the pattern of interconnects (610). For example, economic feasibility may be preserved while weight and size are saved by some components being mounted on the casing and some components mounted on a modular graphics card, sound card, keyboard components, or the like.

Figure 7:
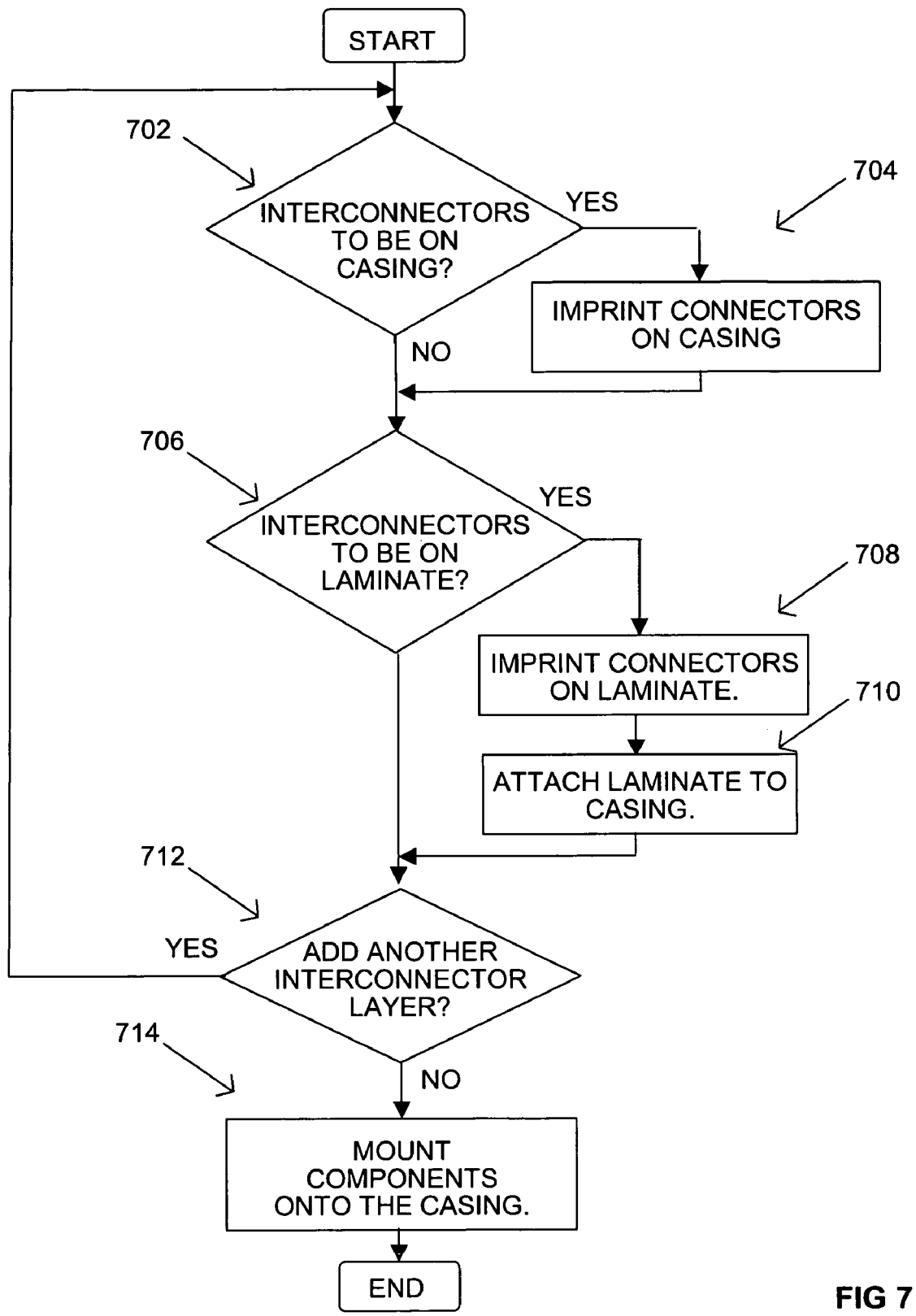
FIG. 7 depicts an example of a flow chart to apply a pattern of interconnects and mount components onto a hardware casing.

FIG. 7 depicts an example of a flow chart (700) to imprint interconnects and mount components onto a hardware casing. Flow chart (700) begins with a decision in element 702 to determine whether to apply interconnects directly to the casing. In particular, when the casing is a regular, non-conductive surface, a pattern of interconnects may be painted or imprinted directly onto the casing (element 704). For example, interconnects may be painted, mesh screened, etched from a coated metal, or the like, to be applied to the casing.

In some embodiments, the application of interconnects to the surface of the casing may depend upon the topography of the surface and, in further embodiments, interconnects are imprinted both on the casing and on a laminate in different parts of the casing in combination. Where the interconnects are applied and components are mounted may depend on factors such as if the surface to be applied onto is curved, a laminate may be elected. For instance, when the surface of the casing is irregular or the interconnects are to be applied around a corner of the casing, the interconnects may be painted onto a laminate (element 708) and the laminate may be fixed to the surface of the casing (element 710).

Similarly, when the casing is a conductive surface, the pattern of interconnects may be applied to a non-conductive laminate (element 708) and the non-conductive laminate may be attached to the surface of the casing (element 710). For example the laminate may be glued, screwed, riveted, shrink-wrapped, or the like, to the casing (element 710). In other embodiments, a wiring path may be etched out of the laminate.

After interconnects have been manufactured into the casing via imprinting, laminating, or both, and if more interconnects are incorporated into a design in layers, multiple layers may be manufactured into the casing. In many embodiments, mounts are then coupled with the casing and with the pattern of interconnects. Mounts may couple with the pattern of interconnects and provide a standard interface to plug in components such as processors, memory, memory cards, or the like.

Element 712 poses a decision of whether another layer of interconnects is to be added. If another layer is to be added, then flow chart (700) proceeds back to element 702; otherwise, flow chart (700) proceeds to element 714.

Once a pattern of interconnects and possibly mounts are attached to the casing, separately manufactured components are mounted onto the casing to add functionality to the device (element 714). Components may serve to add functionality, for example, a speaker or microphone capability on an audio recorder, such as the audio recorder in FIG. 1.

Components may include, for instance, sensors. If one or more sensors are included, then sensors of the design may be mounted on the casing so that the sensors may be accessibly exposed to the exterior of the device. In this way, the sensors may gather readings of environmental conditions and also may be connected to the circuitry through the casing. Thus, in element 714, the sensors may be connected through the casing to the pattern of interconnects.

In several embodiments, the interconnects and components may be protected from moisture and contaminants by application of a conformal coating, such as an acrylic-based, epoxy-based, urethane-based, paraxylylene-based and silicone-based material. Because conformal coatings aid to prevent short circuits and corrosion of conductors and solder joints, conformal coatings are often applied over electronic circuitry in a thin layer, for example, typically a few mils. In some embodiments, a conformal coating is applied by dipping the hardware casing surface in a conformal coating solution. In other embodiments, conformal coatings may be applied through spraying the conformal coating onto the hardware casing surface. In further embodiments, a conformal coating is applied by select coating, or a simple flow or brush coating. To ensure complete coverage on the interior surface of the hardware casing, conformal coatings may contain additives that allow easy UV inspection, for example, Dow Corning's silicone conformal coatings.

In addition, conformal coatings also provide protection of the insulation resistance of the circuit board and may provide stress relief. For stress relief, companies such as Dow Corning offer silicone conformal coatings that cure with a rubbery, elastomeric surface. These materials are solventless with both room-temperature and heat-accelerated cures. Finally, to repair a component or interconnect on the hardware casing, a conformal coating may be removed by using solvent-swell, mechanical abrasion, or standard burn-through techniques.

It will be apparent to those skilled in the art having the benefit of this disclosure that the present invention contemplates methods and arrangements for applying a pattern of interconnects and mounting one or more components to a hardware casing. It is understood that the form of the invention shown and described in the detailed description and the drawings are to be taken merely as examples. It is intended that the following claims be interpreted broadly to embrace all the variations of the example embodiments disclosed.

What is claimed is:

1. A method for mounting components to a hardware casing for an electronic device, comprising:
   determining a pattern of interconnects to apply to an interior surface of an enclosure of the hardware casing for the electronic device, the enclosure having an outside surface to enclose the electronic device, to utilize the hardware casing as a circuit board on the interior surface as well as an enclosure for the electronic device, the pattern to comprise at least one independent path to apply on the interior surface for transmitting a signal along the interior surface between mounting sites for the components;
   wherein coupling the components to the interior surface comprises mounting a sensor to the hardware casing to couple the sensor with the pattern of interconnects
   applying the pattern of interconnects to the interior surface to interconnect the mounting sites; and
   mounting an integrated circuit to the interior surface on at least one of the mounting sites, interconnecting the integrated circuit with the at least one independent path.

2. The method of claim 1, further comprising coupling at least one switch as one of the components to the interior surface with the pattern of interconnects and exposed via the outside surface of the enclosure.

3. The method of claim 2, wherein coupling the components to the interior surface comprises coupling the components to the hardware casing to dissipate heat generated by the components via contact with the hardware casing.

4. The method of claim 1, wherein mounting the sensor comprises mounting the sensor to the interior surface of the hardware casing to sense environmental conditions via the hardware casing.

5. The method of claim 1, wherein determining comprises adapting the pattern of interconnects for application on to the interior surface, wherein the pattern of interconnects is designed for application on to a flat surface.

6. The method of claim 1, wherein applying comprises applying a second layer of material over the pattern of interconnects, wherein the second layer comprises a non-conductive material, a second pattern of interconnects, and a connection to the first pattern of interconnects.

7. The method of claim 1, wherein applying comprises attaching a mount to the interior surface, the mount being coupled with the pattern of interconnects and being adapted to couple the pattern of interconnects with a component of the components.

8. The method of claim 1, wherein applying comprises painting the pattern of interconnects onto the interior surface with a conductive material, wherein the interior surface is a substantially non-conductive material.

9. The method of claim 8, wherein painting comprises applying the pattern of interconnects to the surface via mesh screening.

10. The method of claim 1, wherein applying the pattern of interconnects to the laminate comprises applying the pattern of interconnects to a non-conductive film and fixing the film to the hardware casing.

11. The method of claim 1, wherein applying comprises coating the interior surface with a sheet of metal, printing wire patterns onto the metal using a compound that resists etching, and subjecting the metal to a chemical etching process that removes all exposed metal.

* * * * *